US008989407B2

(12) United States Patent
Kikkawa et al.

(10) Patent No.: US 8,989,407 B2
(45) Date of Patent: Mar. 24, 2015

(54) AUDIO CONTROL METHOD AND AUDIO CONTROL APPARATUS

(75) Inventors: Teruki Kikkawa, Yokohama (JP); Yasuhiro Matsuura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 986 days.

(21) Appl. No.: 12/640,726

(22) Filed: Dec. 17, 2009

(65) Prior Publication Data

US 2010/0166226 A1 Jul. 1, 2010

(30) Foreign Application Priority Data

Dec. 26, 2008 (JP) ................................. 2008-334476

(51) Int. Cl.
*H03G 3/00* (2006.01)
*H04S 3/00* (2006.01)

(52) U.S. Cl.
CPC ............. *H04S 3/008* (2013.01); *H04S 2400/13* (2013.01)
USPC ............. 381/109; 381/104; 381/81; 381/123; 381/120; 381/119; 330/124 R

(58) Field of Classification Search
CPC ....... H04S 3/008; H04S 2400/13; H03G 3/04; H03G 1/02; H03G 3/001; H03G 1/0088; H03G 3/02
USPC ............... 381/81, 123, 120, 119, 109, 80, 77, 381/107, 104; 330/124 R
See application file for complete search history.

(56) References Cited

U.S. PATENT DOCUMENTS 7,792,311 B1 * 9/2010 Holmgren et al. .............. 381/61
2002/0131611 A1 * 9/2002 Hoover et al. ................ 381/123
2004/0066938 A1 * 4/2004 Heron et al. .................... 381/59
2004/0213421 A1 10/2004 Jacobs
2007/0165883 A1 7/2007 Toda
2007/0195964 A1 * 8/2007 Yokota ............................ 381/26
2008/0101589 A1 * 5/2008 Horowitz et al. ........ 379/388.03
2008/0137872 A1 * 6/2008 Croft ............................... 381/55
2009/0220110 A1 * 9/2009 Bazarjani et al. ............. 381/120

FOREIGN PATENT DOCUMENTS

JP 2004-343414 12/2004

OTHER PUBLICATIONS

TPA6203A1, 1.25-W Mono Fully Differential Audio Power Amplifier, Texas Instruments, Jun. 2008. Product Datasheet, 29 pages.*
Apr. 15, 2010 European Search Report of the counterpart European Patent Application No. 09180470.8.

* cited by examiner

*Primary Examiner* — Vivian Chin
*Assistant Examiner* — Con P Tran
(74) *Attorney, Agent, or Firm* — Cowan, Liebowitz & Latman, P.C.

(57) ABSTRACT

A channel conversion part (214) performs channel conversion on audio data of a plurality of channels so that the number of channels thereof is converted to an appropriate number of channels for which an acoustic effect can be verified or perceived by audience according to the volume level of reproduced sound, and audio is output only with a required number of channels. In addition, a frequency control part (215) for controlling the operating frequencies of switching regulators (220-223) of audio amplifiers (224-227) also performs frequency control according to the volume level of sound of each channel which performs an audio output.

10 Claims, 8 Drawing Sheets

FIG.8

| VOLUME SETTING VALUE | NUMBER OF CHANNELS |
|---|---|
| 0 TO V1 | 2 CHANNELS |
| V1 TO V2 | 5.1 CHANNELS |
| V2 OR MORE | 7.1 CHANNELS |

INPUT SOURCE: 7.1 CHANNELS OR MORE

AUDIO CONTROL METHOD AND AUDIO CONTROL APPARATUS

BACKGROUND OF THE INVENTION

1. Field of the Invention

The present invention relates to an audio control method and an audio control apparatus which controls an audio system equipped with a plurality of amplifiers that perform amplification of audio data.

2. Description of the Related Art

A widespread of digital broadcasting in recent years has made it possible for people to enjoy multichannel acoustic sounds. In advanced digital satellite broadcasting, a 22.2-channel multi-sound system is proposed in addition to current 2-channel and 5.1-channel surround sound systems. The 22.2-channel multi-sound system is composed of a group of speakers including an upper layer of nine channels, a middle layer often channels and a lower layer of three channels, which are arranged in a vertical direction, and 2 channels of LFEs (Low Frequency Effects) which are placed on a floor surface.

Upper layer speakers are used for the purposes of localizing a sound image at locations above an audience or listener, and expressing an early reflected sound and a rear reverberant sound. Moreover, the upper layer speakers can express the vertical movement of the sound image by mutual use of the middle layer and the lower layer. Middle layer speakers can reproduce the most main sound sources, and can express acoustic sounds common to existing multichannels such as 2 channels, 5.1 channels and 7.1 channels, and so on. Lower layer speakers are used for localizing a sound image below the audience. For example, the lower layer speakers are used to express sound sources at a lower portion of a screen, such as the sound of footsteps, the sound of a stream on a river surface, etc. In addition, the 2 channel LFEs are low-frequency effects channels for generally reproducing a low-frequency component of 120 Hz or less, and are used for expressing the feeling of sound spreading, etc.

Multichannel sound can reproduce a higher-precision sound space by means of speakers with different frequency characteristics together with their arrangement. Here, human aural characteristics will be considered. The frequencies of sound which humans can perceive are said to be from 20 Hz to 20 kHz. However, the volume of sound which humans feel changes with frequency. Human conversations are conducted in the frequency range of 200-8,000 Hz, and human sensitivity is the highest in the range of 1,000-3,500 Hz. That is, a sound can be heard at different volume levels if its frequency varies, even with the same sound intensity. This means that even in the human audible frequency range, a sound in a low frequency area or in a high frequency area can not be heard unless it has a certain amount of sound volume.

While multichannel audio can provide listeners with a high sense of realism or a high-quality sound effect, it increases the number of reproduction speakers, and accordingly the number of amplifiers required. In addition, in multichannel audio, a wide range of tones can be expressed, but sound in a frequency band of unclear acoustic effects is subjected to output processing, depending on the volume level thereof, so there arises a problem of increasing power consumption.

Japanese patent application laid-open No. 2004-343414 describes a technique that suppresses power consumption by controlling switching power supplies which supply electric power to amplifiers. In this Japanese patent application laid-open No. 2004-343414, the power consumption is intended to be reduced by controlling a switching frequency according to a set value of the volume level of sound of an audio output. Specifically, as the set value of the volume level becomes smaller, the switching frequency is accordingly lowered, whereby a loss due to a switching operation is reduced, thus suppressing the consumption of electric power.

However, the technique described in Japanese patent application laid-open No. 2004-343414 is on the premise of a 2-channel sound system, and no consideration is given to the reduction of power consumption in a multi-channel sound system of three or more channels.

A 5.1-channel surround sound system and a 7.1-channel multichannel sound system, which make use of reflected sound and reverberant sound and give effects according to respective frequency bands, are different in the volume level of reproduced sound for which acoustic efficiency can be verified or perceived. In these sound systems, power consumption cannot be reduced in an efficient manner only by performing the same switching frequency control as in a 2-channel sound system. That is, in order to achieve the efficient use of electric power while obtaining an optimal acoustic efficiency, it becomes important to control the number of channels of audio output.

SUMMARY OF THE INVENTION

The present invention provides an audio control method and an audio control apparatus which can obtain an acoustic effect according to the volume of sound, and at the same time, suppress wasteful power consumption as much as possible thereby to achieve the efficient use of electric power in an acoustic system which performs the reproduction control of audio data of a plurality of channels.

The present invention in its first aspect provides an audio control method for an audio system which is provided with a plurality of amplifiers that amplify audio data of a plurality of channels to cause a plurality of speakers to output the amplified audio data, and in which a volume level corresponding to volume of sound outputted from the audio system can be set by a listener, the method comprising the steps of: determining a number of output channels according to the volume level set by the listener; and driving the amplifiers corresponding to the number of the output channels determined to thereby perform audio output.

The present invention in its second aspect provides an audio control apparatus for driving a plurality of speakers, comprising: a plurality of amplifiers that amplify audio data of a plurality of channels; a volume level setting unit for setting a volume level corresponding to volume of sound outputted from an audio system on the basis of an operation of a listener; determining unit for determining a number of output channels according to the volume level set by the listener; and driving unit for driving the amplifiers corresponding to the number of the output channels determined by the determining unit to thereby perform audio output.

According to the present invention, it is possible to obtain an acoustic effect according to the volume of sound and suppress wasteful power consumption as much as possible thereby to achieve the efficient use of electric power even in an audio system which reproduces and outputs audio data of a plurality of channels.

Further features of the present invention will become apparent from the following description of exemplary embodiments with reference to the attached drawings.

BRIEF DESCRIPTION OF THE DRAWINGS

FIG. 8 is a view explaining the relation of the volume level of reproduced sound for which an acoustic effect can be verified or perceived with respect to the number of audio channels in a channel transducer of FIG. 2.

DESCRIPTION OF THE EMBODIMENTS

Hereinafter, embodiments carrying out the present invention will be described in detail by way of example with reference to the attached drawings.

However, the function, relative arrangement and so on of component parts described in the embodiments are not intended to limit the scope of the present invention to these alone unless otherwise indicated to the contrary. In addition, in the following description, it is assumed, unless particularly described as otherwise, that the construction, configuration, function, shape and so on of each component part, which are once described, are the same as in the first explanation.

Figure 1:
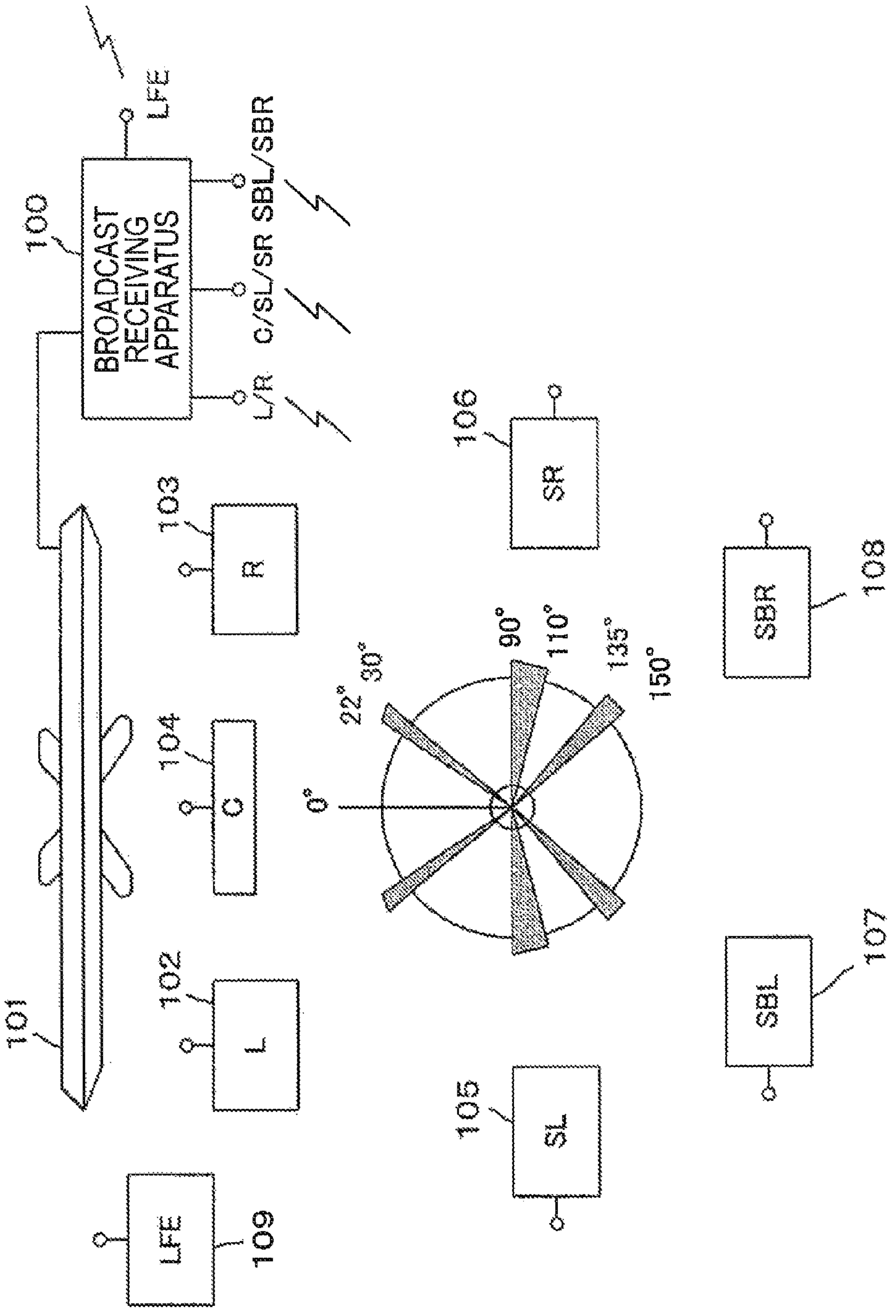
FIG. 1 is a schematic diagram of the system structure of a broadcast receiving apparatus to which an audio control apparatus of the present invention can be applied.

FIG. 1 is a schematic diagram showing the system structure of a broadcast receiving apparatus to which an audio control method and an audio control apparatus of the present invention can be applied.

In this figure, 100 denotes the broadcast receiving apparatus. The broadcast receiving apparatus 100 achieves a broadcast receiving function in a broadcast receiving system 101 denotes a display part such as a display panel (in the form of a LCD TV, or a plasma TV, or a CRT, or a surface-conduction electron-emitter display, etc). The display part 101 receives and displays images output from the broadcast receiving apparatus 100. The broadcast receiving apparatus 100 and the display part 101 are connected to each other by means of a signal line which can transmit video data.

Reference numerals 102-109 denote speakers. These speakers 102-109 and the broadcast receiving apparatus 100 are connected to each other by means of signal lines which can transmit audio data. The signal line connecting between the broadcast receiving apparatus 100 and the display part 101 and the signal lines connecting between the broadcast receiving apparatus 100 and the speakers 102-109 may be either of wireless circuits or wire circuits. As wireless circuits, there are available various standard specifications such as Wireless HDMI (High-Definition Multimedia Interface), BlueTooth, etc. In addition, as wire circuits, there are available RCA terminals, HDMI terminals, and so on.

The speakers 102-109 are compatible, for example, with a 7.1 channel multi-sound system. Main speakers 102, 103 denoted as L (left) and R (Right), respectively, are arranged at the front left and right of an audience. In addition, the speakers 104, 105, 106 denoted as C (Center), SL (Surround Left) and SR (Surround Right), respectively, are arranged, as surround channels, at the front center and at the left-hand side and right-hand side of the audience. Moreover, the speakers 107, 108 denoted as SBL (Surround Back Left) and SBR (Surround Back Right), respectively, are set at the right and left rears of the audience. Further, the speaker 109 denoted as LFE (Low Frequency Effects) is arranged at the front left of the audience for a low-pitched sound region.

Figure 2:
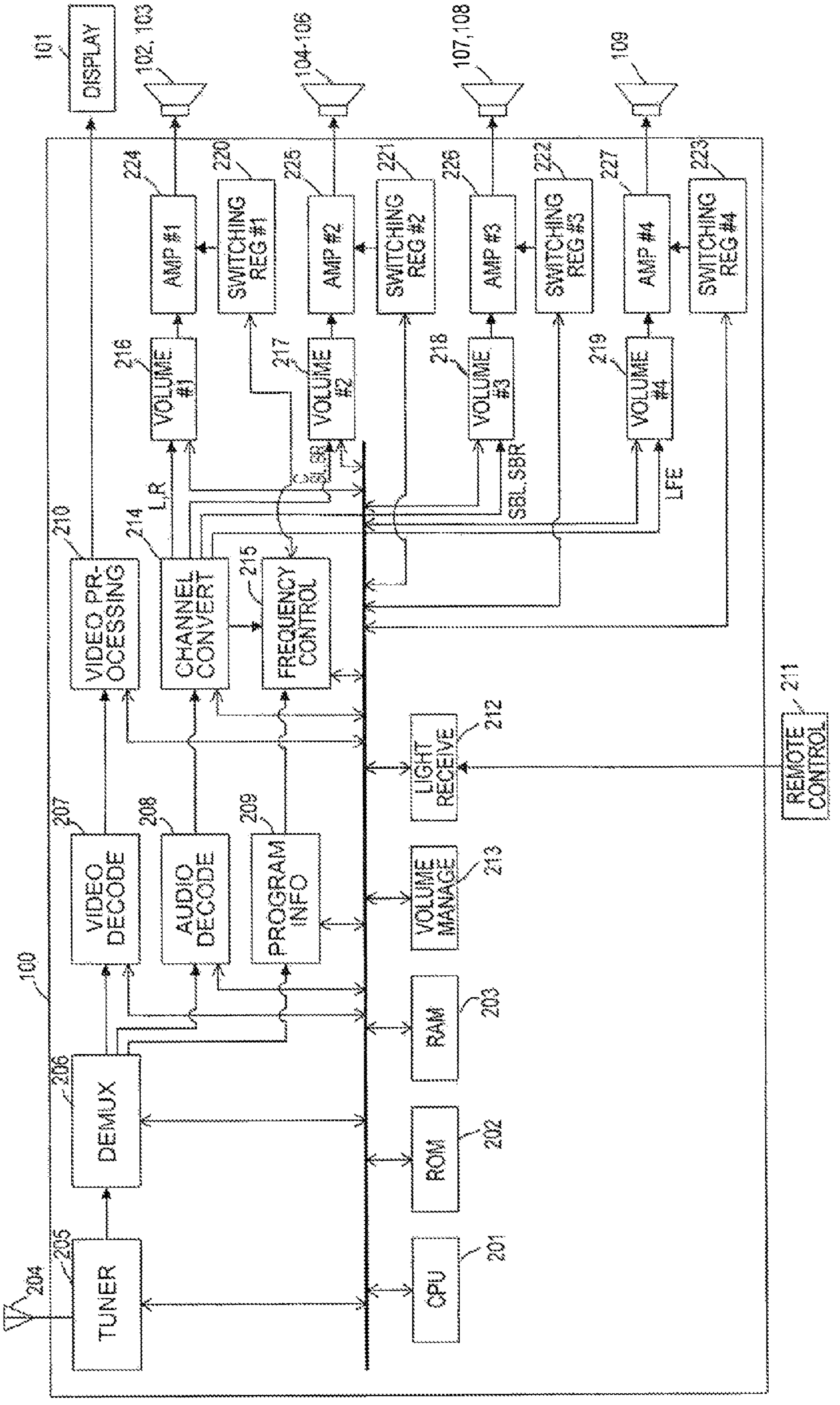
FIG. 2 is a view showing an example of the internal configuration of the broadcast receiving apparatus of FIG. 1 to which the audio control apparatus of the present invention is applied.

FIG. 2 shows the internal configuration of the broadcast receiving apparatus 100. In this figure, a CPU 201 controls the broadcast receiving apparatus 100 according to a program stored in a ROM 202. A RAM 203 is a volatile memory, and is used as a working memory for the CPU 201, and at the same time as a temporary storage area for various data.

A tuner 205 demodulates broadcast waves received from an antenna 204, and outputs baseband video and audio data.

A demultiplexer (demux) 206 performs frame decomposition of the data received from the tuner 205, and separates video data, audio data and program information data from one another. The video data separated by the demultiplexer 206 is input to a video decoder part 207.

The video decoder part 207 performs decoding processing on MPEG2 coded video data. The video data thus decoded is subjected to I/P conversion processing, gamma processing, scaling processing, etc., in the video processing part 210, and thereafter is output for display in the display part 101.

Next, reference will be made to the control of the audio data of the above-mentioned audio system. The audio control apparatus according to the present invention is formed by part of the above-mentioned broadcast receiving apparatus 100, and is provided with an audio decoder part 208 acting as an input part into which audio data is input, audio amplifiers (#1-#4) 224-227 acting as a plurality of amplifiers, a volume management part 213 acting as a volume level setting unit, and a channel conversion part 214.

In addition, the audio control apparatus is further provided with switching regulators (#1-#4) 220-223 acting as switching power supplies that supply electric power to the audio amplifiers (#1-#4) 224-227, and a frequency control part 215 that controls the operating frequencies of the switching regulators (#1-#4) 220-223.

Further, provision is made for volume control parts (#1-#4) 216-219 that act as a volume level control part for controlling the each volume level of sound outputted from the each speakers 102-109, based on the volume level set by the volume management part 213.

The audio data of the plurality of channels separated by the demultiplexer 206 is input to the audio decoder part 208. In the audio decoder part 208, the audio data encoded in the MPEG2-AAC (ISO/IEC 13818-7) format is subjected to decoding processing, so that it is converted into a linear PCM format. The audio data converted into the linear PCM form is input to the channel conversion part 214 to be detailed later.

The program information data separated in the demultiplexer part 206 is input to a program information processing part 209. The program information data is transmitted in a data structure specified by a standard specification "Service Information used for Digital Broadcasting" in ARIB (Association of Radio Industries and Businesses), etc. An SDT (Service Description Table) for transmitting information related to organization channels is included, as main configuration data, in the program information data. In addition, an EIT (Event Information Table) for transmitting information related to programs, such as the titles of the programs, broadcasting hours, the classification of components to be transmitted, etc., are also included. The program information processing part 209 in this embodiment acquires the component information of audio data which is at least output for reproduction from, for example, EIT, etc.

Specifically, the program information processing part 209 acquires, as component information, the channel information of received audio data such as 2.1 multichannels, 5.1 surround channels, etc., and down mix coefficients used by down mix processing to be described later. Here, note that it is preferable to configure that down mix coefficients be acquired from the program information data, but it may be configured that down mix coefficients are beforehand held as initial values by the channel conversion part 214.

The volume management part 213 sets the volume level corresponding to volume of sound outputted from the audio system. The volume level of sound is operated by means of a remote control 211. The remote control 211 transmits a control signal as an infrared light signal according to the operation of a user, and the infrared light signal is received by an infrared light receiving part 212. The CPU 201 generates and outputs various kinds of commands and control signals for controlling the broadcast receiving apparatus 100 from the infrared light signal received by the infrared light receiving part 212.

For example, when the user performs a sound level control operation by using the remote control 211, the CPU 201 generates a volume switching signal. This volume switching signal is supplied to the volume management part 213, and a volume setting value as a volume level of sound thus set is notified from the volume management part 213 to the volume control parts (#1-#4) 216-219, the channel conversion part 214 and the frequency control part 215.

The channel conversion part 214 determines a prescribed number of output channels according to the volume setting value set by the volume management part 213, and performs channel conversion of input audio data into a number of pieces of audio data corresponding to the number of output channels in cases where the number of channels of the input audio data differs from the number of output channels selected according to the volume setting value. The channel conversion part 214 holds, as a table, an optimal number of channels with respect to the volume setting value, and performs channel conversion processing on the input audio data based on the volume setting value.

The table has sound level threshold information for channel switching. The channel conversion part 214 makes a comparison between the volume level of sound set by the volume management part 213 and the sound level threshold information (value), and performs channel switching when the volume level of sound thus set is equal to or larger than the sound level threshold value or when the volume level of sound thus set is equal to or less than the sound level threshold value.

The channel conversion processing in this embodiment is down mix processing, for example. The down mix processing is to convert multichannel audio data into audio data of a desired number of channels by multiplying it by weights called down mix coefficients and adding them together.

In general, down mix processing is applied in cases where the number of speakers used for reproduction is smaller as compared with the number of channels of audio data, but as a feature of this embodiment, the down mix processing is performed based on the volume setting value. For example, as the volume setting value is lowered in a state where 7.1 multichannel sound is output, the human audible range becomes narrower as human aural characteristics, so it gradually becomes difficult for one to feel sound in a low frequency area or in a high frequency area, as well as in a specific band of intermediate frequencies. In addition, an acoustic effect in a band(s) expressed by reflected sound or reverberant sound is no longer obtained by audience.

Accordingly, in the present invention, the dynamic range of audio data is compressed by performing channel conversion processing, so that a maximum acoustic effect can be obtained within the audible range in that volume setting value. That is, when the volume setting value is lowered and the acoustic effect of 7.1 multichannel sound is no longer obtained to a satisfactory extent, the audio data is channel converted from 7.1 channel sound into 5.1 channel surround sound. Moreover, as the sound volume is lowered, the audible range similarly becomes narrower, so the 5.1 surround sound is channel converted into 2 channel sound. On the contrary, when the volume setting value is raised from the 2 channel state and becomes an audible range in which the acoustic effect of 5.1 surround sound is obtained, the 2 channel sound is converted into 5.1 surround sound, and when the sound volume is further raised, the audio is output as 7.1 multichannel sound, which is the original audio data.

The channel conversion part 214 inputs front two channels, L and R components, among the converted audio data, into the volume control part (#1) 216, C, SL and SR components into the volume control part (#2) 217, SBL and SBR components into the volume control part (#3) 218, and an LFE component in the form of a low-frequency component into the volume control part (#4) 219, respectively. Then, the channel conversion part 214 notifies to the frequency control part 215 the number of channels of audio data to be actually output as a result of the channel conversion.

The frequency control part 215 determines the prescribed operating frequencies of the individual switching regulators (#1-#4) 220-223 according to the volume setting value set by the volume management part 213 and the number of output channels acquired by the channel conversion part 214. The operating frequencies set here are frequencies that are beforehand set so as to provide an optimal power supply efficiency at each volume setting value, and are stored in the frequency control part 215.

In addition, the volume control parts (#1-#4) 216-219 adjust gains for the audio data input from the channel conversion part 214 according to the volume setting value.

Then, the operating frequencies of the individual switching regulators (#1-#4) 220-223 are controlled based on the operating frequencies thus determined, respectively. The frequency control part 215 stops the operations of the switching regulators (#1-#4) 220-223 for output channels for which it has been determined by the channel conversion part 214 that no output is made. Those output channels for which it has been determined that no output is made are other than those output channels for which it has been determined that an output is made.

The switching regulators (#1-#4) 220-223 operate according to the operating frequencies specified from the frequency control part 215, so that electric power is supplied to the audio amplifiers (#1-#4) 224-227.

When supplied with electric power, the audio, amplifiers (#1-#4) 224-227 perform switching amplification of the corresponding audio data, and perform audio outputs from the speakers 102-109 after performing D/A conversion processing thereon.

As stated above, the control of the audio control apparatus is to amplify the audio data of a plurality of channels by means of the plurality of audio amplifiers (#1-#4) 224-227 thereby to output them from the plurality of speakers 102 through 109, wherein the volume level of sound can be set by a listener. In the present invention, the channel conversion part 214 determines a prescribed number of output channels according to the volume setting value set by the listener, so that audio amplifiers corresponding in number to the output channels thus determined are driven to perform audio outputs.

Figure 3:
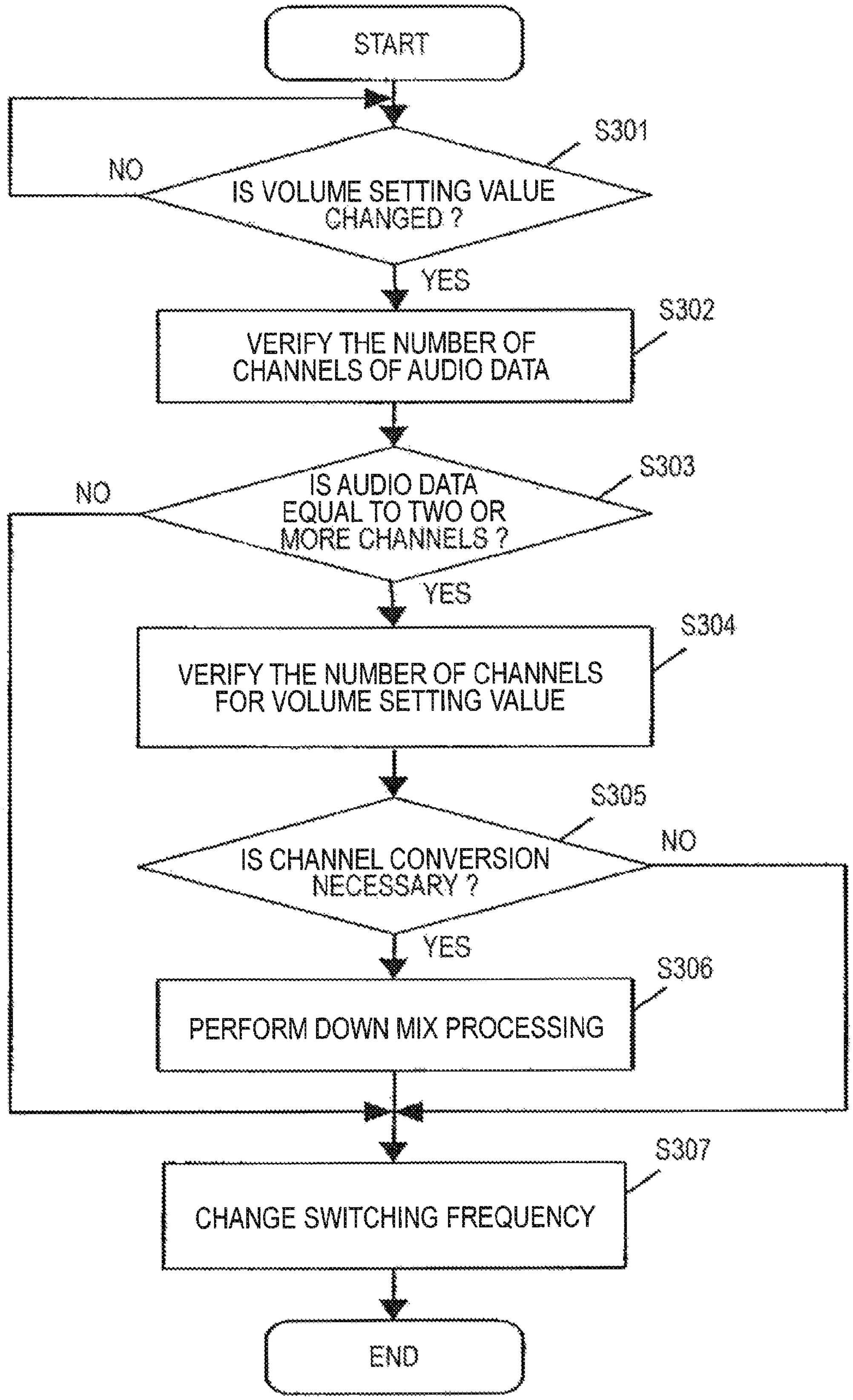
FIG. 3 is a flow chart that relates to the processing of the audio control apparatus in the apparatus configuration of FIG. 2.
Figure 4:
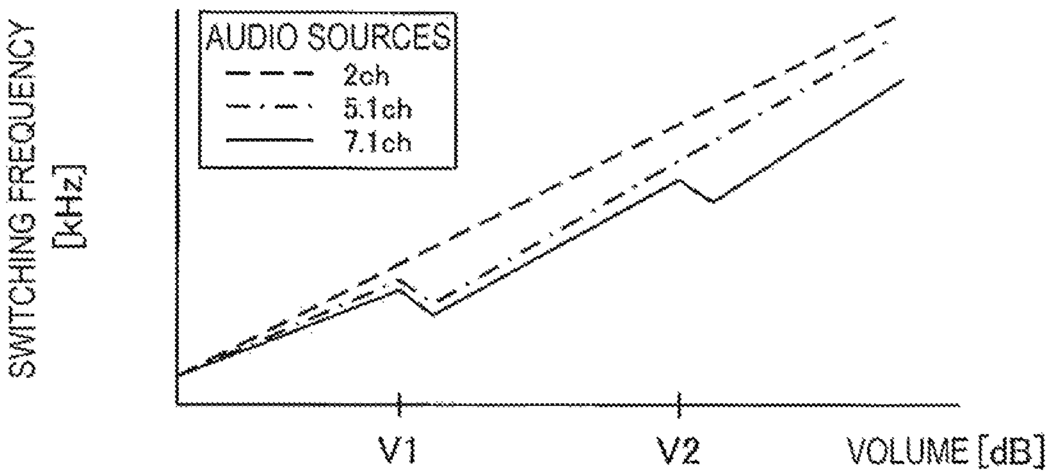
FIG. 4 is a view explaining the relation between volume setting values and switching frequencies of a switching regulator (#1) of FIG. 2.
Figure 5:
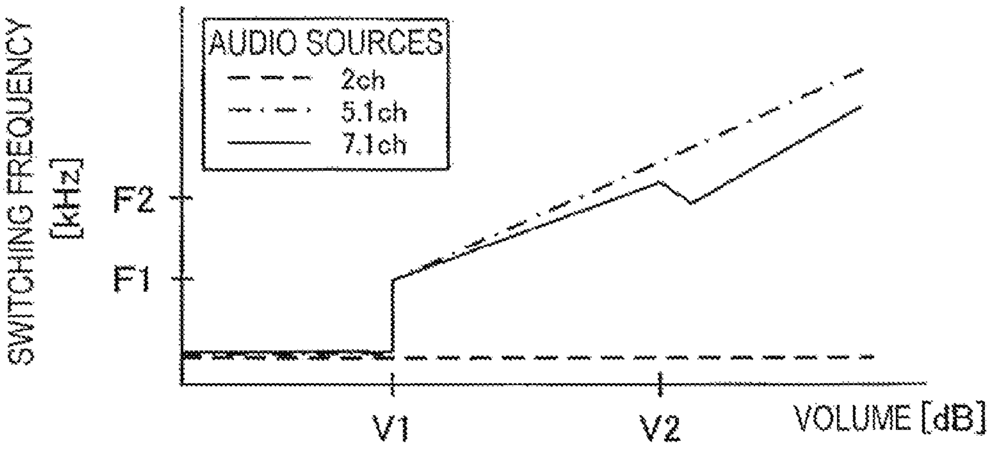
FIG. 5 is a view explaining the relation between volume setting values and switching frequencies of a switching regulator (#2) of FIG. 2.
Figure 6:
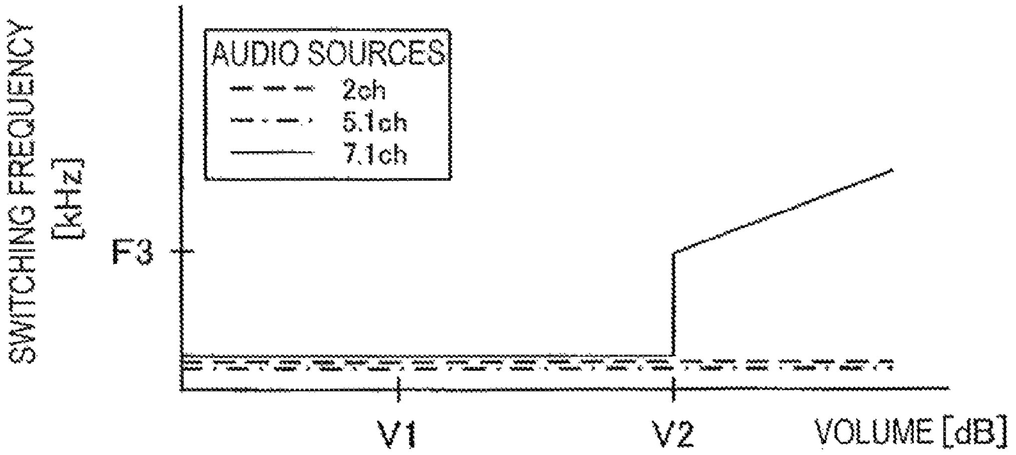
FIG. 6 is a view explaining the relation between volume setting values and switching frequencies of a switching regulator (#3) of FIG. 2.
Figure 7:
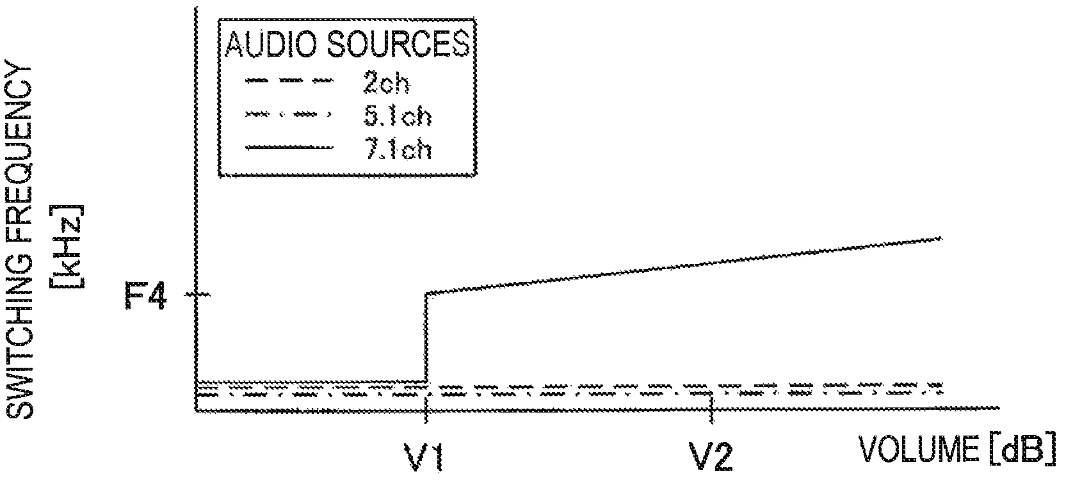
FIG. 7 is a view explaining the relation between volume setting values and switching frequencies of a switching regulator (#4) of FIG. 2.

Next, reference will be made to an operation at the time of changing the volume while referring to a flow chart of FIG. 3 as well as FIG. 4 through FIG. 7. In the flow chart of FIG. 3, a description will be given by focusing on the operations of the channel conversion part 214, the frequency control part 215, and the switching regulators (#1-#4) 220-223, which are the features of the embodiment. In addition, for the sake of simplification of the description, it is assumed that 7.1 multichannel audio data is transmitted by a broadcast wave.

When a user changes the volume by operating the remote control 211 (S301), the CPU 201 generates a volume switching signal, and notifies it to the volume management part 213. Then, the volume management part 213 in turn notifies it to the channel conversion part 214 and the frequency control part 215 as a volume setting value.

When notified that the volume setting value has been changed, the channel conversion part 214 acquires the number of channels of audio data to be used as audio outputs from the program information processing part 209 (S302). In this example, it can be seen from audio component information that 7.1 multichannel audio data are transmitted.

In cases where the audio data in the form of an input source has two or more channels, the channel conversion part 214 determines the number of channels suitable for the current volume setting value (S303, S304). Then, when it is determined that channel conversion is necessary (S305), down mix processing is performed on the audio data (S306), and the audio data is input to the audio amplifiers (#1-#4) 224-227 by way of the volume control parts 216-219.

FIG. 8 illustrates the relation of the volume level of reproduced sound for which an acoustic effect can be verified or perceived with respect to the number of audio channels. For example, in the case of 7.1 multichannels, when the volume setting value is equal to or larger than a threshold of V2, the acoustic effect thereof can be verified or perceived, and in the case of 5.1 channel surround sound, the effective volume setting value is in the range of V1-V2, and also in the case of 2 channel sound, it is in the range of V0-V1. Accordingly, in cases where the input audio source is 7.1 multichannel sound, down mix processing is carried out when the volume setting value is less than the threshold of V2. In addition, in cases where the input audio source is 5.1 surround sound, when the volume setting value is equal to or larger than the threshold of V1, 5.1 surround sound is unchanged, but when the volume setting value is less than the threshold of V1, down mix processing is carried out.

Then, the frequency control part 215 determines and applies the operating frequencies of the switching regulators (#1-#4) 220-223 in accordance with the number of channels and the volume setting value of the audio data after the channel conversion notified from the channel conversion part 214 (S307).

FIG. 4 through FIG. 7 illustrate examples of the operating frequencies of the switching regulators (#1-#4) 220-223 with respect to the number of channels and the volume setting value. The frequency control part 215 controls the switching regulators (#1-#4) 220-203 in such a manner that they operate with switching frequencies which give optimum efficiencies prescribed with respect to the individual values of the volume setting value, respectively. In addition, the frequency control part 215 stops the switching operations of those of the switching regulators (#1-#4) 220-223 which control an audio component(s) for which an output(s) becomes unnecessary. That is, only audio amplifiers corresponding to the number of output channels determined by the channel conversion part 214 are driven to operate.

In addition, at the time of channel switching such as switching from a 2 channel sound to a 5.1 channel surround sound, from a 5.1 surround sound to a 7.1 multichannel sound, etc., the frequency control part 215 controls to maintain the sound pressure at a fixed or constant level so that the sound volume may not suddenly become large due to the channel conversion. That is, in cases where the number of channels is converted by means of the channel conversion part 214, the volume control part 216-219 regulates the sound volumes so as to make the sound pressure constant before and after a threshold value (in spite of channel switching), and the operating frequencies of the switching regulators (#1-#4) 220-223 are controlled based on the volume levels regulated by the volume control part 213.

Specifically, the volume control part 216-219 regulates the volume so that the volume of an audio component before being added is lowered and the volume of an added audio component is raised. Moreover, the frequency control part 215 raises the operating frequency of a switching regulator corresponding to an audio component added at the time of channel switching, and lowers the operating frequency of a switching regulator corresponding to an audio component before being added.

Here, note that in the above-mentioned embodiment, the description has been made by taking, as an example, the case where the number of channels of audio data to be input decreases, but the present invention is also applicable to a case in which when the number of channels of audio data to be input is small, the number of channels to be output is controlled to increase according to the volume level of sound. In this case, too, by increasing the number of output channels according to the volume level of sound, it becomes possible to obtain an optimal acoustic effect, and at the same time to achieve the efficient use of electric power.

As described above multichannel audio data is subjected to channel conversion so that the number of channels thereof is converted to an appropriate number of channels for which an acoustic effect can be verified or perceived according to the volume level of reproduced sound. As a result, audio is output with only necessary channels, and frequency control is carried out according to the volume value of each channel for which an audio output is performed, so it becomes possible to obtain an optimal acoustic effect according to the sound volume, and it also becomes possible to suppress wasteful power consumption as much as possible thereby to achieve the efficient use of electric power.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-334476, filed on Dec. 26, 2008, which is hereby incorporated by reference here in its entirety.

What is claimed is:

1. A signal processing apparatus comprising:

an input unit that inputs a plurality of channels of audio data;

a detection unit that detects a number of channels of the audio data input by the input unit;

a receiving unit that receives an instruction for setting volume of sound by a listener;

a driving unit that controls output of sound by a plurality of speakers;

a determining unit that determines a number of output channels according to the volume set by the instruction received by the receiving unit, wherein if the set volume is lower than a threshold value, the determining unit determines that a number less than a number of channels corresponding to an arrangement of the plurality of speakers as the number of output channels;

a processing unit that processes the input audio data in accordance with the number of channels of the input audio data detected by the detection unit and the number of output channels determined by the determining unit, wherein the processing unit generates, from the input audio data, audio data for outputting of a number of channels corresponding to the determined number of output channels, if the audio data of the number of channels same as the number of channels corresponding to the arrangement of the plurality of speakers is inputted by the input unit and if the number of output channels determined by the determining unit is less than the number of channels of the input audio data detected by the detection unit;

a control unit that controls the driving unit in accordance with the number of output channels determined by the determining unit and the set volume, wherein the control unit selects speakers for outputting sound corresponding to the audio data for outputting from among the plurality of speakers in accordance with the number of output channels determined by the determining unit and controls the driving unit such that the selected speakers output the sound corresponding to the audio data for outputting and a speaker other than the selected speakers is stopped from outputting sound, and wherein the control unit controls the driving unit such that volume of the sound, which is outputted by the selected speakers and corresponds to the audio data of the number of output channels for outputting, is changed in accordance with the set volume.

2. An apparatus according to claim 1, wherein the determining unit compares the set volume and the threshold value and determines the number of output channels in accordance with the comparison result.

3. An apparatus according to claim 1, wherein:

the driving unit comprises a plurality of amplifiers that amplifies audio data to be output to the plurality of speakers and a plurality of switching power supplies that supply electric power to the plurality of amplifiers; and wherein the control unit controls an operating frequency of switching power supply for supplying electric power to the amplifier for amplifying the audio data for outputting in accordance with the volume set by the instruction received by the receiving unit.

4. An apparatus according to claim 3, wherein:

the control unit stops the operation of the switching power supplies that supply electric power to the amplifiers for amplifying audio data corresponding to sound outputted by the other speaker.

5. An apparatus according to claim 1, wherein in a case that the number of output channels determined by the determining unit is changed, the control unit controls the driving unit to regulate volume of the sound output by the selected speakers such that sound pressure of the selected speakers is maintained constant in spite of performing channel changing.

6. A signal processing method comprising the steps of:

inputting a plurality of channels of audio data;

detecting a number of channels of the input audio data;

receiving an instruction for setting volume of sound by a listener;

determining a number of output channels according to the volume set by the instruction, wherein if the set volume is lower than a threshold value, the determining unit determines that a number less than a number of channels corresponding to an arrangement of the plurality of speakers as the number of output channels;

processing the input audio data in accordance with the detected number of channels of the input audio data and the determined number of output channels, wherein the step of processing generates, from the input audio data, audio data for outputting of a number of channels corresponding to the determined number of output channels, if the audio data of the number of channels same as the number of channels corresponding to the arrangement of the plurality of speakers inputted and if the number of output channels determined is less than the detected number of channels of the input audio data; and controlling output of sound by a plurality of speakers, wherein speakers for outputting sound corresponding to the audio data for outputting are selected from among the plurality of speakers in accordance with the determined number of output channels and the plurality of speakers are controlled such that the selected speakers output the sound corresponding to the audio data for outputting and a speaker other than the selected speakers is stopped from outputting sound; and volume of the sound, which is outputted by the selected speakers and corresponds to the audio data of the number of output channels for outputting, is controlled so as to be changed in accordance with the set volume.

7. A method according to claim 6, wherein the step of determining compares the set volume and the threshold value and determines the number of output channels in accordance with the comparison result.

8. A method according to claim 6, wherein, in the step of controlling, an operating frequency of a switching power supply for supplying electric power to an amplifier for amplifying the audio data for outputting is controlled in accordance with the set volume.

9. A method according to claim 8, wherein, in the step of controlling, the operation of the switching power supplies that supply electric power to the amplifiers for amplifying audio data corresponding to sound outputted by the other speaker is stopped.

10. A method according to claim 6, wherein, in the step of controlling, volume of the sound output by the selected speakers is regulated such that sound pressure of the selected speakers is maintained constant in spite of performing channel changing, in a case that the number of output channels determined by the determining unit is changed.

* * * * *